United States Patent [19]
Kohda et al.

[11] Patent Number: 5,467,457
[45] Date of Patent: Nov. 14, 1995

[54] READ ONLY TYPE SEMICONDUCTOR MEMORY DEVICE INCLUDING ADDRESS COINCIDENCE DETECTING CIRCUITS ASSIGNED TO SPECIFIC ADDRESS REGIONS AND METHOD OF OPERATING THE SAME

[75] Inventors: Kenji Kohda; Yasuhiro Kouro, both of Hyogo, Japan

[73] Assignee: Mitsubishi Denki Kabushiki Kaisha, Tokyo, Japan

[21] Appl. No.: 867,541

[22] Filed: Apr. 13, 1992

[30]     Foreign Application Priority Data

May 2, 1991 [JP] Japan ..................... 3-100749

[51] Int. Cl.$^6$ ............... G06F 12/00; G06F 11/16; G11C 17/10; G11C 29/00
[52] U.S. Cl. .............. 395/429; 395/421.01; 365/200; 365/94; 365/189.07; 364/DIG. 1
[58] Field of Search .................. 395/425, 575, 395/400; 371/10.1, 10.2; 365/200, 104, 94, 189.07

[56]            References Cited

U.S. PATENT DOCUMENTS

| | | | |
|---|---|---|---|
| 4,639,897 | 1/1987 | Wacyk | 365/200 |
| 4,942,556 | 7/1990 | Sasaki et al. | 365/200 |
| 4,958,377 | 9/1990 | Takahashi | 365/49 |
| 5,179,536 | 1/1993 | Kasa et al. | 365/200 |

FOREIGN PATENT DOCUMENTS

| | | |
|---|---|---|
| 63-53639 | 10/1988 | Japan. |
| 64-5397 | 1/1989 | Japan. |

*Primary Examiner*—Glenn Gossage
*Attorney, Agent, or Firm*—Lowe, Price, LeBlanc & Becker

[57]            ABSTRACT

A read only semiconductor memory device includes a plurality of address coincidence detecting circuits, each of which has a specific address region assigned thereto and generates an address coincidence detecting signal when an input address signal designates an address in the assigned region. A priority circuit determines a priority order among the plurality of address coincidence detection signals from the plurality of coincidence detecting circuits. In accordance with a signal to which priority is given by the priority circuit, a data output terminal receives memory cell data read from a memory array or is fixed at a predetermined logical level. With respect to a memory address region containing a succession of only data of logic "1" or "0" (that is, a region with all "1's" or "0's"), data of a logical level predetermined by a switching circuit is output to the data output terminal. For this memory address region, fixed data, which is not read from the memory array, is outputted. Therefore, a defective bit in this memory address region can be repaired efficiently, resulting in a high product yield of the read only semiconductor memory device.

21 Claims, 15 Drawing Sheets

FIG. 4

| Qn1 | Qn2 | CIRCUIT OPERATION FOR AN ADDRESS BIT An |
|---|---|---|
| D | E | SELECTED UPON RECEPTION OF "0" |
| E | D | SELECTED UPON RECEPTION OF "1" (FIG. 3) |
| D | D | NORMALLY SELECTED An IS "DON'T CARE" |
| E | E | NORMALLY NONSELECTED An IS "DON'T CARE" |

\* "SELECTED STATE" INDICATES THAT Qn1 AND Qn2 BOTH TURN ON

FIG. 6

| Q11 | Q12 | OUTPUT OF SWITCHING CIRCUIT 21 (FIG. 5) |
|---|---|---|
| D | E | "L" LEVEL ("0") |
| E | D | "H" LEVEL ("1") |

FIG. 8

| Q31 | Q32 | POTENTIAL LEVEL AT NODE N1 | "H" LEVEL ACTIVATING GATE G34 | "L" LEVEL DEACTIVATING GATE G34 (FIG. 7) |
|---|---|---|---|---|
| D | E | | | |
| E | D | | | |

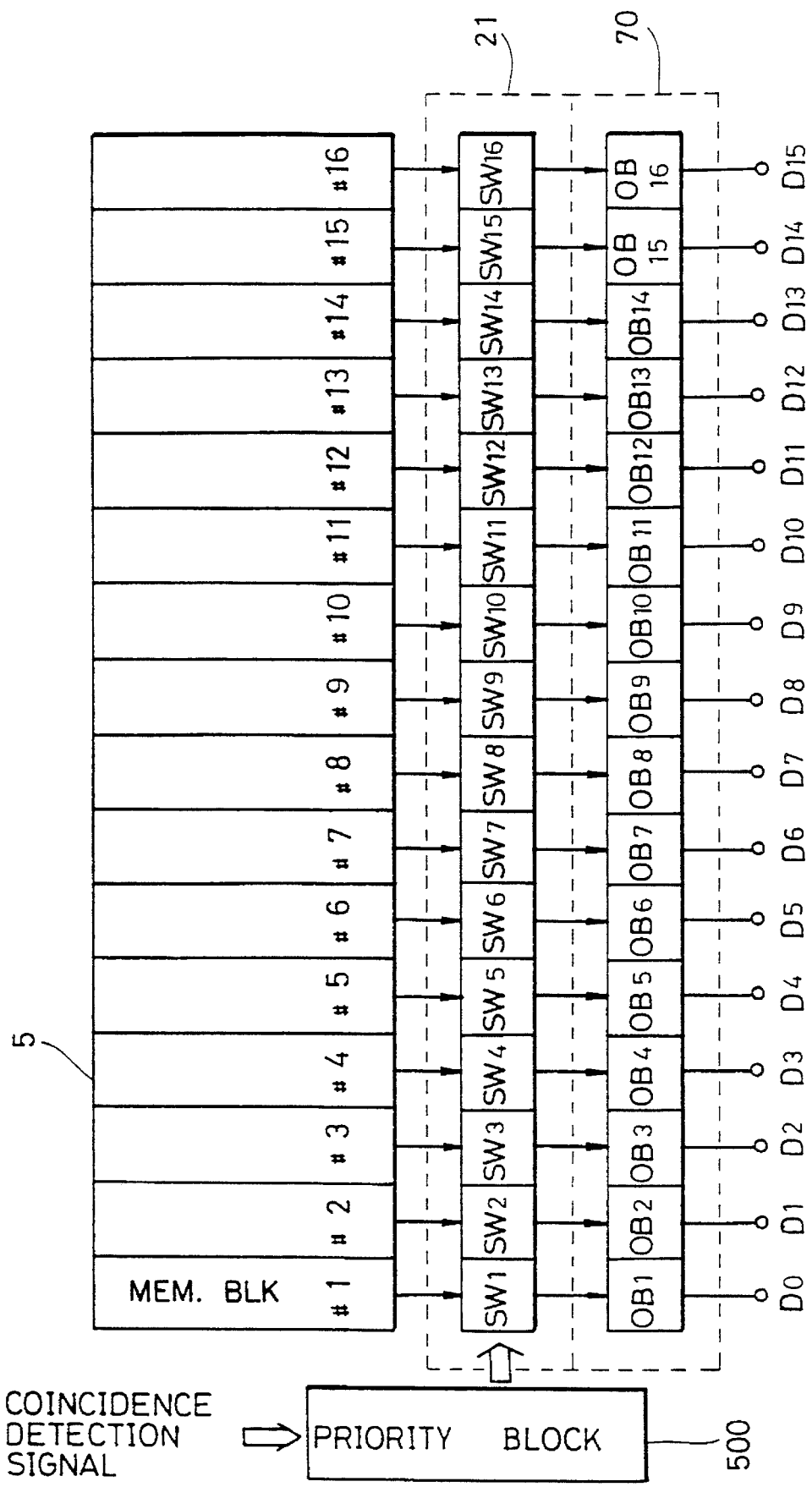

READ ONLY TYPE SEMICONDUCTOR MEMORY DEVICE INCLUDING ADDRESS COINCIDENCE DETECTING CIRCUITS ASSIGNED TO SPECIFIC ADDRESS REGIONS AND METHOD OF OPERATING THE SAME

TITLE OF THE INVENTION

Read Only Memory Device Including Address coincidence Detecting Circuits Assigned To Specific Address Regions and Method of Operating the Same

BACKGROUND OF THE INVENTION

1. Field of the Invention

The present invention relates to a read only semiconductor memory device, and particularly to a construction and method for repairing a defective bit in a mask ROM (read only memory).

2. Description of the Related Art

Semiconductor memory devices include read only memory devices, e.g., ROM memory (referred to simply as ROM hereinafter) for storing fixed data. Such a ROM has a bit formed of one transistor to provide a suitable construction for high integration and reduced cost per bit. Therefore, ROMs have been widely used in various applications.

Generally, for effective utilization of the ROM, valid data are written over a full memory space (address space) thereof. In some applications, however, the memory space of the ROM is partially maintained in an unused (or undefined) state.

The storage capacity of a ROM is mainly determined by the number of address bits and the number of bits of read out data. For example, if an address comprises 20 bits and read out data comprises 8 bits, the storage capacity of such a ROM is 8 mega bits=$2^{20} \times 8$ (=1 M bytes). The ROM is used for storing an application specific program or data. If the program or data requires 640 K bits, a ROM with 1 M bit storage capacity is used because available ROM's storage capacity is predetermined, as 256 K bits, 512 K bits, 1 M bit and so on. In this case, the remaining address region (360 K bits in the above example) is maintained in the unused state or undefined state. In general, data of a predetermined fixed logic level is written into the memory cells in the remaining unused address region. As an example, a Kanji-character generator in accordance with the Japanese Industrial Standard will now be considered.

FIG. 14 shows a mapping of a memory space of a ROM used in such a Kanji-character generator. In FIG. 14, a memory space 100 of the ROM includes regions 101 and 103 for having valid data written therein where a Kanji character code is allotted and a Kanji character is defined, and an undefined region 102 where a Kanji character is not defined while a character code is allocated, and an unused region 104 where a character code as well as Kanji characters are not defined. In code assignment of Kanji characters in accordance with the Japanese Industrial Standard, one Kanji character is defined by a first byte (area) indicating an X-address and a second byte (point) indicating a Y-address. In the Kanji character code assignment, the first type comprises 7 bits and the second byte comprises 7 bits, so that $2^{14}$ (=16384) Kanji characters can be defined. However, only 7144 Kanji characters are defined in the Japanese Industrial Standard. The remaining 9240 Kanji characters are not defined, and the region 102 is maintained in the undefined state. If the employed ROM has the storage capacity of $2^{16}$ bytes (=64 K bytes) when one Kanji-character requires one byte, 12 K ($2^{16}-2^{14}$) addresses or 12 K byte memory cells are used to produce the unused region 104. In this assignment, the 8th to 15th areas are in the undefined state.

In a mask ROM, data is written in a manufacturing process. Therefore, data of predetermined logic, i.e., logic "0" or "1" is written in the undefined region (or unused region) in such a mask ROM. A manufacturer can use the undefined region 102 to define desired additional Kanji characters as necessary.

For economical reasons, a mask ROM has been proposed that includes a redundant circuit for outputting data of a predetermined logical level of logic "0" or "1" when an address of region 102 is designated, in order to construct the ROM having the mapping shown in FIG. 14 and the ROM having valid data written in the undefined region 102 in the same chip. An example of such ROMs has been disclosed in the Japanese Examined Patent Publication No. 63-53639 (Unexamined Patent Publication No. 60-95793) and Japanese Examined Patent Publication No. 64-5397 (Unexamined Patent Publication No. 60-115098).

FIG. 15 schematically shows a whole construction of a conventional mask ROM. In FIG. 15, the mask ROM includes a memory array 5 having a plurality of memory cells arranged in a matrix of rows and columns, an address buffer 1 for performing waveform shaping and amplification of an address signal applied to an address input terminal 10 to generate an internal address signal, an X-decoder 2 which decodes an internal row address signal supplied from address buffer 1 to select a row in memory array 5, a Y-decoder 3 which decodes an internal column address signal supplied from address buffer 1 to generate a signal for selecting a column in memory array 5, and a Y-gate 4 which responds to a column selecting signal supplied from Y-decoder 3 to connect a corresponding column in memory array 5 to a sense amplifier 6. An address signal applied to address input terminal 10 includes address bits A0–An. In the ROM, generally, bits of data from a word is read from memory array 5. Therefore, the column selecting signal supplied from Y-decoder 3 designates a plurality of columns in memory array 5. Sense amplifier 6 detects and amplifies the data of the memory cells selected by Y-gate 4.

The ROM further includes an address coincidence detecting circuit 9 which receives an internal address signal from address buffer 1 to determine whether or not the internal address signal designates an address in a specific region in memory array 5, and an output circuit 7 which is responsive to a coincidence detection signal from address coincidence detecting circuit 9 to select, as data to be transmitted to data output terminal 11, one of memory cell data supplied from sense amplifier 6 and data of a predetermined logical level. Coincidence detecting circuit 9 stores in advance an address signal (region address signal) indicative of the specific region in memory array 5, and detects coincidence/noncoincidence of the region address signal and an internal address signal from address buffer 1. Output circuit 7 includes a predetermined level fixing circuit (not shown), which is activated upon generation of the coincidence detection signal from address coincidence detecting circuit 9 to set the potential level of output terminal 11 at a predetermined potential.

The ROM further includes a control circuit 8 which receives an externally applied chip enable signal /CE and an output enable signal /OE to generate various kinds of internal control signals. Generally, address buffer 1 is formed of a static circuit, and generates an internal address signal as externally applied address signal bits A0–An are received. Control circuit 8 generates an internal control signal for determining an activation timing of sense amplifier 6 and a data output timing of output circuit 7. The activation timing of sense amplifier 6 is determined by chip enable signal /CE. The data output timing of output circuit 7 is determined by output enable signal /OE. An operation will be described below.

Address coincidence detecting circuit 9 has been programmed to store the region address signal indicative of the specific memory region (i.e., address region) in memory array 5. Address buffer 1 generates an internal address signal based on external address signal bits A0–An applied to address input terminal 10. The internal address signal includes an internal row address signal and an internal column address signal.

X-decoder 2 decodes the internal row address signal from address buffer 1 to select a corresponding row in memory array 5. The memory cells connected to the selected row in the memory array 5 are connected to the corresponding columns. While X-decoder 2 is carrying out the row selecting operation, Y-decoder 3 decodes the internal column address signal from address buffer 1 to generate the column selecting signal. Y-gate 4 responds to the column selecting signal to connect a corresponding column in memory array 5 to sense amplifier 6.

In memory array 5, the potential of each column has changed in accordance with the data stored in each related memory cell, when Y-gate 4 performs the column selecting operation. Sense amplifier 6 detects and amplifies the signal potential on the column selected by Y-gate 4. Data of the memory cells detected and amplified by sense amplifier 6 is transmitted to output circuit 7.

When address signal bits A0–An designate an address in the address region stored in address coincidence detecting circuit 9, address coincidence detecting circuit 9 generates the coincidence detecting signal. When the address coincidence detecting signal is generated, output circuit 7 activates the predetermined level fixing circuit included therein, ignores the data of the memory cells transmitted from sense amplifier 6, and sets the potential level of data output terminal 11 at the predetermined level of the logic "1" or "0". In this operation, output data D0–Dm is "1 . . . 1", or "0 . . . 0".

When address coincidence detecting circuit 9 does not generate the coincidence detecting signal, output circuit 7 sets the predetermined level fixing circuit included therein at the inactive state, and transmits the memory cell data received from sense amplifier 6 to data output terminal 11.

According to the above construction, all the data stored in the memory space (or address region) designated by address coincidence detecting circuit 9 can be forcedly changed to the logic "1" or "0".

In the construction of the ROM shown in FIG. 15, an arbitrary region in the memory space made by memory array 5 can be changed into the region which stores only the data of the logic "0" or "1". An arrangement in which the above construction is applied to a redundant circuit for repairing a defective bit in a mask ROM is disclosed by Hotta et al. in the article titled "HIGH DENSITY MASK ROM MEMORY CELL WITH A BANK SELECTION ARCHITECTURE AND A NEW REDUNDANCY SCHEME FOR MASK ROM", Institute of Electronics, Informations, Communications and Electrics Engineers, Technology Research Report, Vol. 88 No. 125, July 1988, pp. 13–18.

In the Hotta et al. reference, when an address of the memory region in which every data provides "0" or "1" is designated, the data read out of the memory cell is rendered invalid, and previously programmed data of "0" or "1" is alternatively output. According to this redundant circuit construction, a defective bit in the memory region stored in the address coincidence detecting circuit can be effectively repaired because ten defective bit data is replaced by the predetermined fixed data of logic "1" or "0". The repairing of defective bits improves the product yield because a ROM having defective bits can be marketed as a reliable product instead of being disposed. The product yield means the rate of accepted or non-defective product to all the products. Even an unused region is required to include no defective bits for a reliable product. The Hotta et al. reference states that, if data in the region including successively data of only "0s" or only "1s" over 2 K bytes or more is replaced with the previously programmed data, using this circuit, it can be expected that a product yield is improved by approximately 5% in 16 M bit mask ROM.

The Hotta et al. reference also discloses that, as the storage capacity of a mask ROM increases, the storage region of the data of only "0s" or only "1s" tends to increase, and such data continuity region becomes approximately 100 K bytes in the 16 M-bit mask ROM.

The construction of the mask ROM described above can easily achieve the replacement of the data in the continuity region 102 shown in FIG. 14 with the data of "0s" or "1s".

However, as shown in FIG. 16, if a region 152 which stores only the data of all "1s" is divided by a region 154 which stores only the opposite logic data, i.e., data of all "0s", the data cannot be replaced effectively. This is true also in a case where region 152 has stored only the data of all "0s" and region 154 has stored only the data of all "0s".

Further, effective data replacement cannot be performed in a case where, as shown in FIG. 17, a memory space 160 contains valid regions (i.e., regions for storing valid data) 162, 166 and 168, and an unused region 164 contains the valid regions 166 and 168. In the construction having a mapping shown in FIG. 17, it is necessary to divide unused region 164 into five regions A, B, C, D and E, and to detect the coincidence of the addresses for the respective regions. Therefore, efficient data replacement cannot be carried out by a simple circuit construction.

Generally, the output data of the mask ROM includes a plurality of bits. In this case, if address regions including the successions of "0" or "1" are respectively related to the different data output pin terminals, i.e., different memory blocks, the above described redundant construction cannot effectively carry out the data replacement. If the mask ROM has a data width of 16 bits, 16 bit data and 8 bit data may be stored therein. If 8 bit data is required, the address regions forming invalid regions are different in the respective memory blocks. Also in this case, the above described redundant construction of the prior art cannot perform effective data replacement.

In the conventional redundant construction of the mask ROM, the predetermined data is replaced only to the regions including only the data having all "0" or "1". Therefore, the replacement of the data cannot be performed flexibly in accordance with the memory regions of the data, and thus the product yield cannot be improved to a large extent.

SUMMARY OF THE INVENTION

It is an object of the invention to provide a read only semiconductor memory device and method of operating the same, which overcomes the above-noted disadvantages of the conventional redundant circuit of the mask ROM and enables efficient data replacement.

It is another object of the invention to provide a read only semiconductor memory device capable of effectively repairing a defective bit and a method therefor.

It is still another object of the invention to provide a read only semiconductor memory device capable of improving a product yield to a large extent.

A read only semiconductor memory device according to a first aspect of the invention includes a plurality of address coincidence detecting circuits, and a priority circuit for assigning priority to coincidence detection signals supplied from the address coincidence detecting circuits. Specific address regions in a ROM address space are assigned to the address coincidence detecting circuits, respectively. Each address coincidence detecting circuit outputs the coincidence detection signal, when a supplied address signal designates a memory address included in the address region assigned thereto.

The read only semiconductor memory device according to the first aspect of the invention further includes a switching circuit, which is responsive to an output signal of the priority circuit, to transmit a data bit of a predetermined logic level to an output terminal.

A read only semiconductor memory device according to a second aspect of the invention includes a plurality of address coincidence detecting circuits, and a priority circuit for assigning priority to coincidence detection signals supplied from the address coincidence detecting circuits. Predetermined address regions in a ROM address space are assigned to the address coincidence detecting circuits, respectively. Each address coincidence detecting circuit outputs a coincidence detection signal, when a supplied address signal designates an address included in the address region assigned thereto.

A read only semiconductor memory device according to the second aspect of the invention further includes a switching circuit, which is responsive to an output signal from the priority circuit, to transmit one of data of predetermined logic and memory cell data read from a ROM memory array to a data output terminal.

In the read only semiconductor memory device according to the first aspect of the invention, the data output terminal is set at a predetermined logic data in accordance with the priority. Therefore, replacement of corresponding data can be efficiently performed even if a data region including successions of "1" or "0" is separated by a data region including successions of logically opposite bits of "0's" or "1's".

The read only semiconductor memory device according to the second aspect of the invention, even if a valid memory cell data region exists in a region including only the successions of "1" or "0" or in an undefined or invalid region, original memory cell data can be easily outputted due to a function of the switching circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a list showing an operation of the address coincidence detecting circuit shown in FIG. 3;

FIG. 6 is a list for showing an operation of the switching circuit shown in FIG. 5;

FIG. 8 is a list for showing an operation of the priority circuit shown in FIG. 7;

FIG. 12 schematically shows a whole construction of a read only semiconductor memory device according to another embodiment of the invention;

DESCRIPTION OF THE PREFERRED EMBODIMENT

Figure 1:
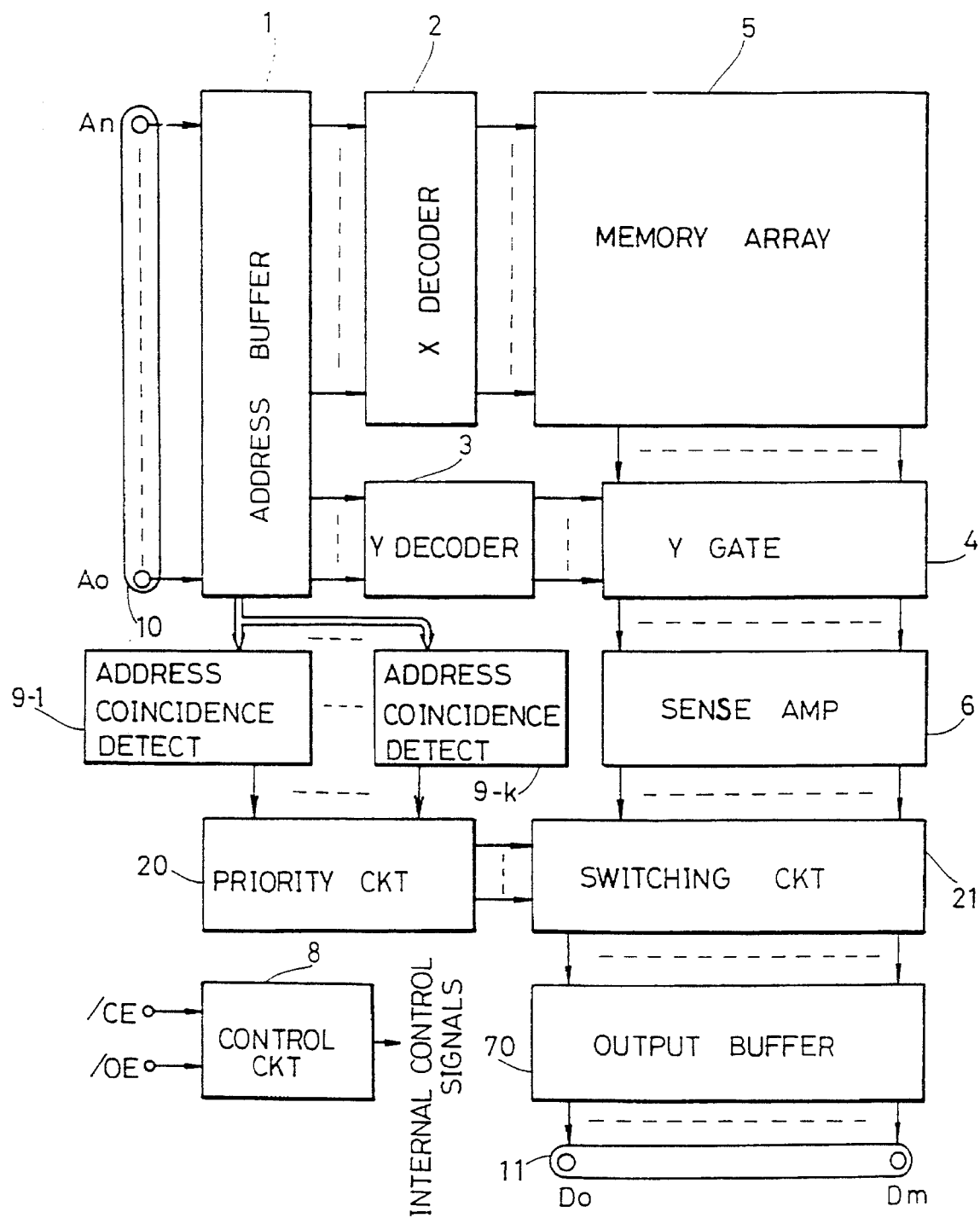
FIG. 1 schematically shows the whole concentration of a read only semiconductor memory device according to an embodiment invention.
Figure 15:
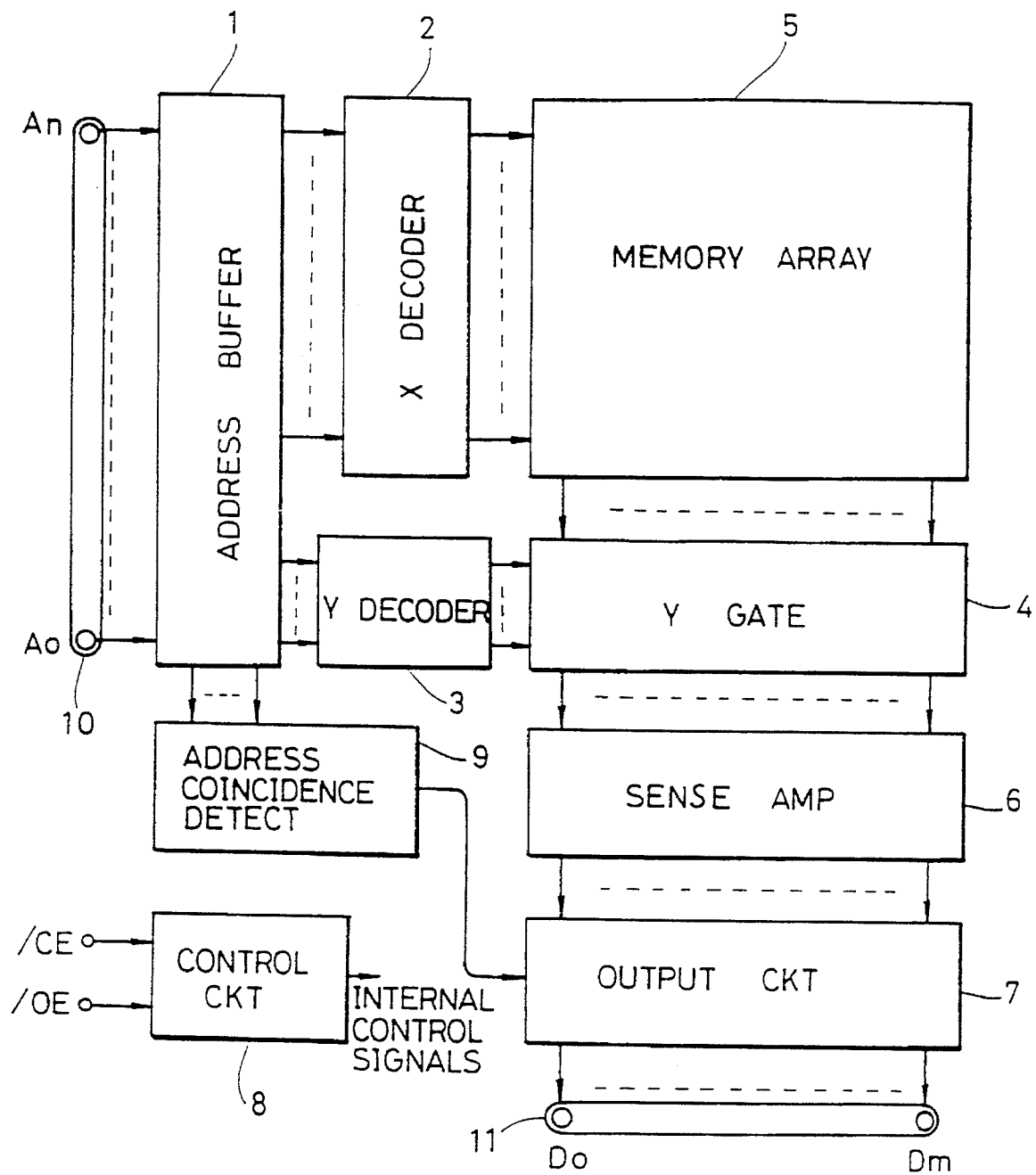
FIG. 15 schematically shows a whole construction of a conventional mask ROM.
Figure 16:
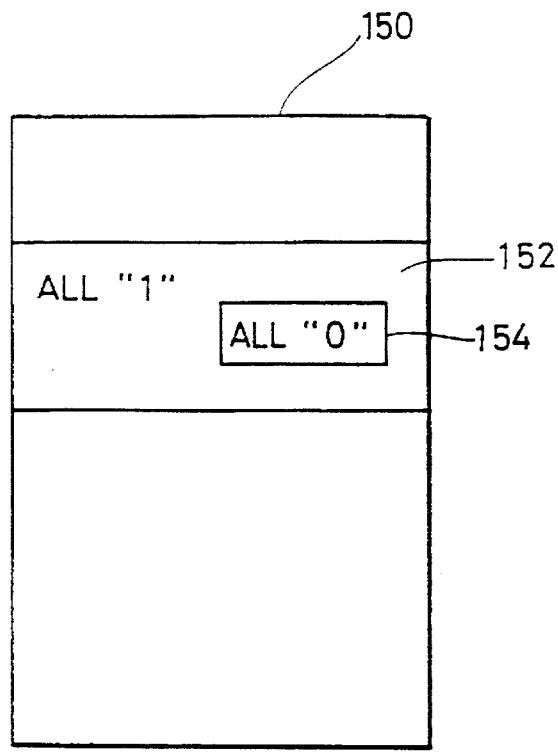
FIG. 16 is a diagram used for explaining a problem of a redundant circuit in a conventional mask ROM.

FIG. 1 is a block diagram schematically showing a whole construction of a read only semiconductor memory device according to an embodiment of the invention. In FIG. 1, portions corresponding to those of the conventional read only semiconductor memory device shown in FIG. 15 are indicated by the same reference numerals. In FIG. 1, a read only semiconductor memory device (referred to as "mask ROM" hereinafter) includes an address buffer 1, an X-decoder 2, a Y-decoder 3, a Y-gate 4, a memory array 5, a sense amplifier 6, a control circuit 8, and an output buffer 70.

The mask ROM shown in FIG. 1 further includes a plurality of address coincidence detecting circuits 9-1 to 9-k for receiving an internal address signal from address buffer 1, a priority circuit 20 which receives the coincidence detection signals from address coincidence detecting circuits 9-1 to 9-k and determines the priority order among the received coincidence detection signals, and a switching circuit 21 which is placed between sense amplifier 6 and an output circuit 7 and is responsive to the output signal supplied from priority circuit 20 to selectively transmit the data of predetermined logic to output circuit 7. Switching circuit 21 is also responsive to the output signal from priority circuit 20 to selectively transmit the memory cell data from sense amplifier 6 to output circuit 7. Output buffer 70 performs waveform shaping and amplification of the output signal of switching circuit 21 to transmit the same to a data output terminal 11.

Specific address regions in the address space (memory space) provided by memory array 5 are assigned to address coincidence detecting circuits 9-1 to 9-k, respectively. Each of address coincidence detecting circuits 9-1 to 9-k checks the values of a predetermined set of the address signal bits in an internal address signal applied from address buffer 1, and determines whether or not address signal A0–An designates a memory address included in the address region assigned to that one of the address coincidence detecting circuits 9-1 to 9-k. If a memory address included in the assigned address region is designated, the coincidence detection signal is outputted.

Figure 2:
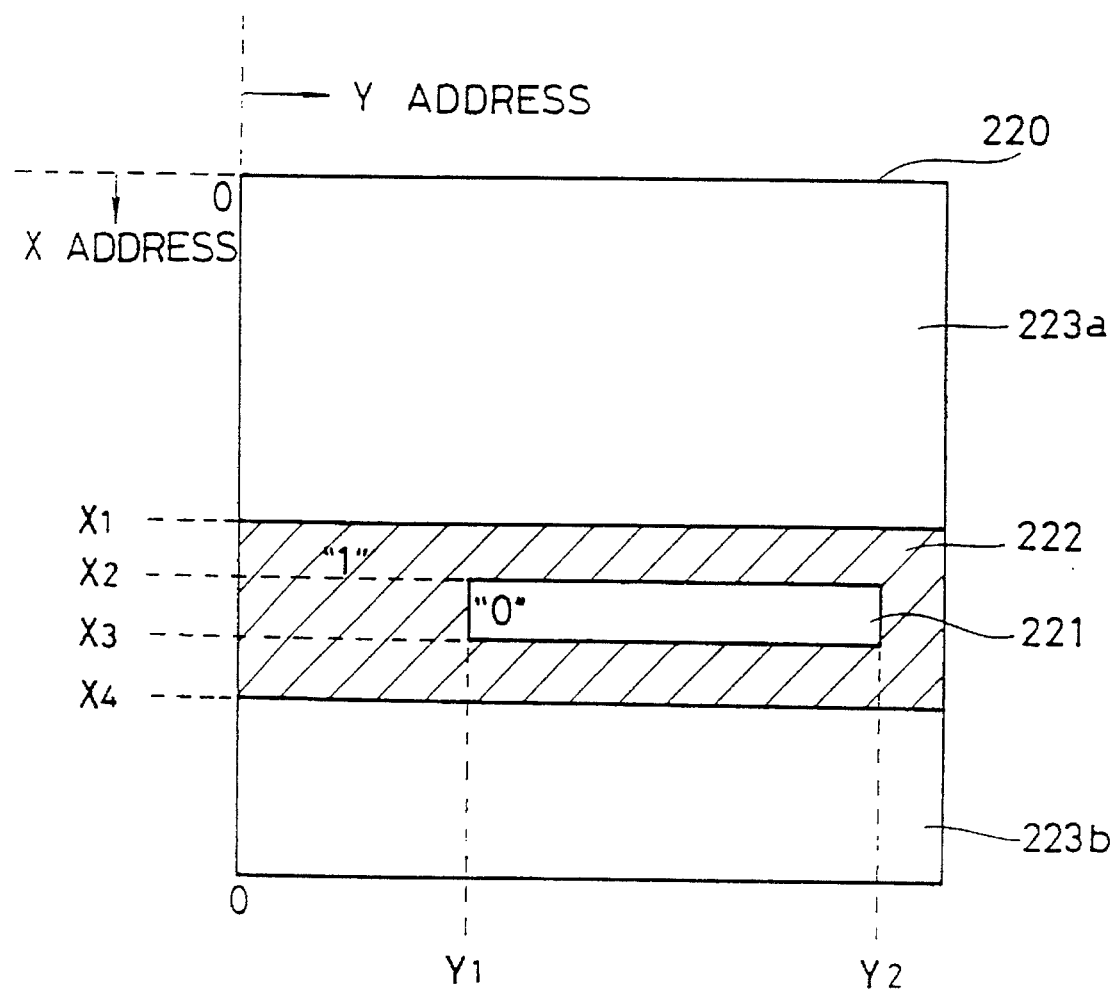
FIG. 2 is a diagram illustrating a data replacement operation of the read only semiconductor memory device shown in FIG. 1.

FIG. 2 shows a bit map of memory array 5. For simplicity, it is assumed that a memory address space 220 shown in FIG. 2 corresponds to a memory address space given by one memory block having corresponding one bit. The memory space, i.e., address space 220 includes regions 223a and 223b in which valid memory cell data is written, a region 222 in which logic "1" data is written, and a region 221 in which logic "0" data is written. An operation of the mask ROM according to an embodiment of the invention will be described below with reference to FIGS. 1 and 2.

The region 223a for valid memory cell data includes addresses within the range of row (X) addresses 0 through X1. The region 222 for "1" data storage includes addresses within the range of row (X) addresses X1 through X2, X addresses X2 through X3 excluding the region of Y addresses Y1 through Y2, and X addresses X3 through X4. The region 221 for "0" data storage includes addresses within the range of X addresses X2 through X3 and Y addresses Y1 through Y2.

It is assumed that the address region of region 221 is assigned to address coincidence detecting circuit 9-1, and that the address regions corresponding to regions 221 and 222 are assigned to address coincidence detecting circuit 9-2 (where, for example, k=2 indicating two address coincidence detecting circuits). When an address of address signal bits A0–An designates an address of region 223a or 223b, address coincidence detecting circuits 9-1 and 9-2 do not generate the coincidence detection signal. In this condition, priority circuit 20 does not carry out any priority ordering operation, and generates and supplies a signal indicating no detection of the address coincidence to switching circuit 21.

X-decoder 2 and Y-decoder 3 select a corresponding memory cell in memory array 5, and the data of the selected memory cell is transmitted through Y-gate 4 and sense amplifier 6 to switching circuit 21. Since switching circuit 21 has been signaled of the fact that priority circuit 20 has not generated the coincidence detection signal, circuit 21 transmits the memory cell data transmitted from sense amplifier 6 to output buffer 70. Data output terminal 11 receives the memory cell data from memory array 5 as output data D0–Dm.

Now, such a case will be considered that an address signal of address signal bits A0–An designates a memory address of region 222. In this case, address coincidence detecting circuit 9-2 outputs the coincidence detection signal. Address coincidence detecting circuit 9-1 does not generate the address coincidence detecting signal. Priority circuit 20 supplies to switching circuit 21 a priority signal for giving priority to the coincidence detecting signal generated by address coincidence detecting circuit 9-2.

In accordance with the priority signal from priority circuit 20, switching circuit 21 ignores the memory cell data from sense amplifier 6, activates the logic "1" output circuit contained therein, and transmits the data of logic "1" to output buffer 70. Thereby, data output terminal 11 receives output data D0–Dm forcedly set at logic "1".

Now, such a case will be considered that an address signal of address signal bits A0–An designates a memory address of region 221. In this case, both address coincidence detecting circuits 9-1 and 9-2 generate address coincidence detection signals. Priority circuit 20 assigns the priority to the coincidence detection signal from address coincidence detecting circuit 9-1 to transmit the same to switching circuit 21. In accordance with the coincidence detection signal having the priority from priority circuit 20, switching circuit 21 ignores memory cell data transmitted from sense amplifier 6, and activates a contained circuit operable to output the logic "0" data to apply the data of logic "0" to output buffer 70. Consequently, data output terminal 11 does not output the memory cell data supplied from memory array 5, but outputs the data of logic "0" generated by switching circuit 21 as output data D0–Dm.

As described above, priority circuit 20 applies the priority ordering to the coincidence detecting signals, so that the data in the region having the continuity of the fixed data in address region 220 can be easily switched from "1" to "0", or conversely from "0" to "1".

According to the above construction, the output data supplied from regions 221 and 222 is not the data read from a memory cell but the data supplied by switching circuit 21, so that defective bits contained in regions 221 and 222 are effectively "repaired" (i.e., the data of the defective bits are not read or use). A specific construction of the switching circuit will be described below with respect to FIG. 5.

Figure 3:
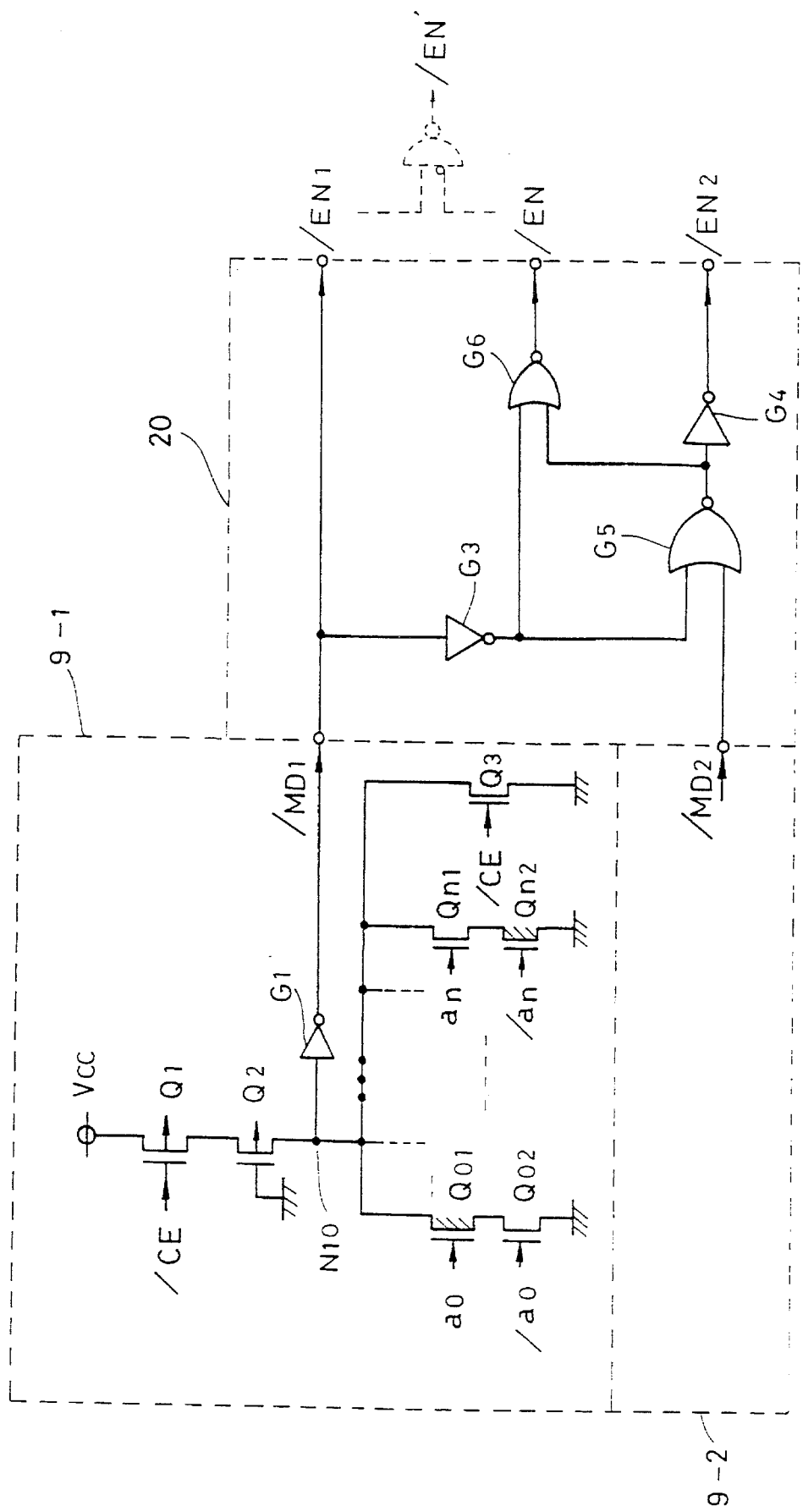
FIG. 3 shows an example of a specific construction of an address coincidence detecting circuit and a priority circuit shown in FIG. 1.

FIG. 3 shows an example of a specific construction of the address coincidence detecting circuit and the priority circuit shown in FIG. 1.

In FIG. 3, address coincidence detecting circuit 9-1 provides an NAND-type decoder. Specifically, it outputs a coincidence detection signal /MD1 which goes to "L" when an address contained in the address region assigned thereto is designated. Address coincidence detecting circuit 9-1 includes metal oxide semiconductor (MOS) insulated gate field effect transistors (IGFETs) Q01, Q02 ... Qn1 and Qn2 for storing the specific address region, e.g., address region 221. Transistors Q01–Qn2 are selectively made to be of a depletion type or an enhancement type. In an example shown in FIG. 3, transistors Q01 and Qn2 are of the depletion type, and transistors Q02 and Qn1 are of the enhancement type. Transistors Q01 and Q02 receive internal address signal bits a0 and /a0 at their gates, respectively. Transistors Qn1 and Qn2 receive internal address signal bits $a_n$ and/$a_n$ at their gates, respectively.

Address coincidence detecting circuit 9-1 further includes a p-channel MOS transistor Q1 which is turned on in response to a chip enable signal /CE to charge a node N10 to "H", an n-channel enhancement type MOS transistor Q3 which is responsive to chip enable signal /CE to precharge node N10 to "L", a p-channel MOS transistor Q2 which is placed between transistor Q1 and node N10 and functions as a load resistance, and an inverter circuit G1 which logically inverts the potential of node N10. A gate of transistor Q2 is fixedly connected to potential "L" such as a ground potential. Transistor Q1 is turned on when chip enable signal /CE goes to an active state of "L", and transistor Q3 is turned on when chip enable signal /CE goes to an inactive state of "H".

Programming for the enhancement type and the depletion type transistors Q01–Qn2 is carried out in the same step as the data writing step for the memory cells in memory array 5 shown in FIG. 1. Specifically, a memory cell in memory array 5 is comprised of one memory transistor which in turn is generally formed of an enhancement MOS transistor. In the data writing process, the enhancement transistors are selectively changed into depletion type transistors in accordance with the write data, so that threshold voltages of memory transistors are selectively set at a negative potential. Transistors Q01 to Qn2 are programmed in the same step as the ion implantation step for writing the data in the memory cells in memory array 5.

If all the memory transistors included in memory array 5 are enhancement type MOS transistors, and the data writing is performed by the adjustment of the threshold voltages thereof to a lower threshold voltage or a higher threshold voltage, all transistors Q01 to Qn2 are formed of enhancement type transistors, and the adjustment of the threshold voltage is performed in the same step as the ion implantation step for the adjustment of the threshold voltages of the memory transistors included in memory array 5.

Address coincidence detecting circuit 9-2 has the same construction as address coincidence detecting circuit 9-1, except for the enhancement/depletion type transistors Q01 to Qn2 for storing the address region.

Priority circuit 20 includes an inverter circuit G3 for inverting coincidence detection signal /MD1 from address coincidence detecting circuit 9-1, a NOR circuit G5 for receiving coincidence detecting signal /MD2 from address coincidence detecting circuit 9-2 and the output signal of inverter circuit G3, a NOR circuit G6 for receiving an output of inverter circuit G3 and an output of NOR circuit G5, and an inverter circuit G4 for inverting an output of NOR circuit G5.

NOR circuit G6 supplies a signal /EN which indicates that an address in a specific address region is designated and which prohibits the transmission of memory cell data. Inverter circuit G4 supplies a preferential signal /EN2 having priority. Address coincidence detecting signal /MD1 is output as a preferential signal /EN1 having the priority.

Address coincidence detecting circuit 9-1 receives internal address signal bits a0, /a0 to $a_n$, /$a_n$ from address buffer 1. Transistors Q01 to Qn2 are turned on and turned off in accordance with the programmed states and the applied address signal bits. The ON/OFF operation of transistors Q01 to Qn2 will be described below with reference to FIG. 4.

FIG. 4 shows an operation of a circuit formed of transistors Qn1 and Qn2 for address signal bit $A_n$.

(i) In a case that transistor Qn1 is programmed to be of the depletion type (D-type), and transistor Qn2 is programmed to be of the enhancement type (E-type): transistor Qn1 is in a normally ON state, and transistor Qn2 is turned on and off depending on the potential of applied address signal bit $A_n$. Internal address signal bit $a_n$ is of the same logic level as the external address signal bit $A_n$, and internal address signal bit /$a_n$ is an inverted signal of internal address signal bit $a_n$. Therefore, when address signal bit $A_n$ is "0", internal address signal /$a_n$ is "1", enhancement type transistor Qn2 is turned on, and both transistors Qn1 and Qn2 are turned on.

Here, logic "0" corresponds to the potential "L", and logic "1" corresponds to the potential "H".

(ii) In a case that transistor Qn1 is programmed to be of the enhancement type, and transistor Qn2 is programmed to be of the depletion type (i.e., in a case shown FIG. 3): transistor Qn2 is in the normally ON state, and transistor Qn1 is turned on when address signal bit $A_n$ is "1". Accordingly, when address signal bit An is "1", both transistors Qn1 and Qn2 are turned on.

(iii) In a case that both transistors Qn1 and Qn2 are of the depletion type: transistors Qn1 and Qn2 are in the normally turned on state regardless of the logical value of the address signal bit $A_n$.

(iv) In a case that both transistors Qn1 and Qn2 are of the enhancement type: one of transistors Qn1 and Qn2 is normally turned off regardless of the logical value of the address signal bit $A_n$. In this case, therefore, address signal bit $A_n$ is in a "don't care" state capable of going to an arbitrary state.

In an actual operation, chip enable signal /CE is "H", so that transistor Q3 is in the ON state and transistor Q1 is in the OFF state. In this condition, node N10 is precharged to "L" by means of transistor Q3. When the mask ROM enters the operation cycle (activated state), chip enable signal /CE goes to the active state of "L", so that transistor Q3 is turned off and transistor Q1 is turned on. Due to the ON state of transistor Q1, node N10 begins to be charged to "H". The potential level of node N10 goes to "H" or "L", depending on internal address signal bits a0, /a0 to $a_n$, /$a_n$ and the programmed state of transistors Q01 to Qn2. In the construction shown in FIG. 3, when address signal bits A1 to An-1 are in the "don't care" state, the decoder circuit is set in the selected state in which all the transistors Q01 to Qn2 are off, and node N10 has the potential of "H" charged by transistors Q1 and Q2 only when address signal bit A0 is "1" and address signal bit An is "0", because transistors Q01 and Qn2 are of the depletion type and transistors Q02 and Qn1 are of the enhancement type. Then, address coincidence detecting signal /MD1 supplied from inverter circuit G1 goes to the active state, i.e., "L". Thus, in the construction shown in FIG. 3, the address region designated by address signal bits A0 and An is represented by "0xxx1" (x: arbitrary value) of address An . . . A0 for a case that an address included in this address region is designated, coincidence detection signal /MD1 goes to the active state of "L". Address coincidence detecting circuit 9-2 has a similar construction. When an address included in the address region assigned thereto is designated, address coincidence detecting signal /MD2 is output.

Address allocation to the address coincidence detecting circuits will now be described more specifically, with reference to FIG. 2. The regions 221 and 222 cover the address region of X addresses X1 through X4. An address includes an X address and a Y address. Now it is assumed that the address X1 is represented by a0, a1, a2, . . . am and the address X4 is represented by a0, a1, b2 . . . bm. In this case, an address included in the regions 221 and 222 is represented by the address of a0, 1a, x, x . . . , x (x: arbitrary). Thus, the address a0, a1, x, x, . . . x is programmed in the detection circuits 9-1. Similarly, the region 221 can be designated by the address of p0, p1, p2, x, . . . x, q0, q1, x . . . x, where the address bits of p0, p1, p2, x . . . x designate an X address within X2 through X3, and the address bits of q0, q1, x, . . . x designate a Y address within Y1 through Y2. Therefore, an address region can be easily stored in the detection circuits 9-1 to 9-k, by the use of a programmable decoder. Then, an operation of priority circuit 20 will be described below.

(i) First, such a case will be considered that coincidence detecting signal /MD1 is generated and coincidence detection signal /MD2 is not generated. In this case, priority signal /EN1 is "L". Since inverter circuit G3 inverts coincidence detection signal /MD1 of "L", one input of each of NOR circuits G5 and G6 receives the signal of "H". Thereby, both NOR circuits G5 and G6 have the outputs of "L". NOR circuit G6 supplies signal /EN indicating that the address of a certain specific address region is designated. Inverter circuit G4 supplies signal /EN2 of "H". In this case, fixed data having a logical value which is predetermined in accordance with address coincidence detecting signal /MD1 is output instead of memory cell data.

(ii) Now, such a case will be considered that only coincidence detecting signal /MD2 is generated. Inverter circuit G3 has the output of "L". Therefore, NOR circuit G5 receives at its both inputs the signal of "L", and thus outputs the signal of "H". Thereby, NOR circuit G6 supplies the signal /EN of "L", and inverter circuit G4 provides the output of "L". In this case, the data of a predetermined logical value in accordance with the address region designated by the coincidence detecting signal /MD2 is output instead of the memory cell data.

(iii) Then, such a case that both coincidence detection signals /MD1 and /MD2 are generated will be considered. In this case, inverter circuit G3 has the output of "H", and NOR circuit G5 outputs "L" regardless of the logical level of coincidence detecting signal /MD2. Since NOR circuit G6 receives at its input the signal of "H" through inverter circuit G3, signal /EN goes to "L". The output signal /EN2 of inverter circuit G4 goes to "H". Therefore, the replacement of the memory cell data is carried out in accordance with the coincidence detection signal /MD1. In the construction shown in FIG. 3, the priority order is given to coincidence detecting signals /MD1 and /MD2, and the signal /EN1 or /EN2 with the priority is outputted, so that the replacement of the memory cell data is carried out in accordance with signal /EN1 or /EN2 having the priority. In this case, coincidence detection signal /MD1 has the priority higher than that of coincidence detection signal /MD2.

Figure 5:
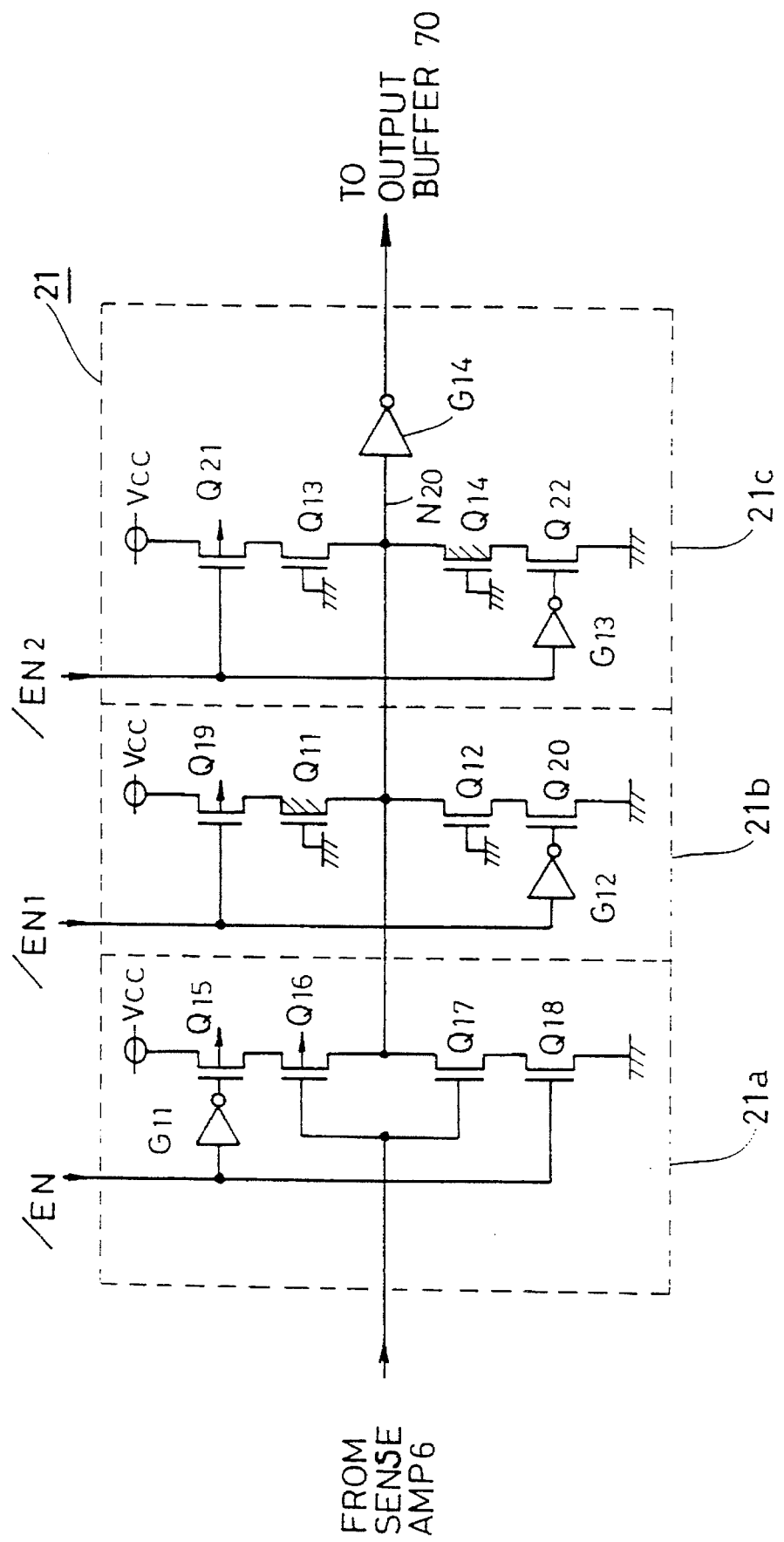
FIG. 5 shows an example of a specific construction of a switching circuit shown in FIG. 1.

FIG. 5 shows an example of a specific construction of switching circuit 21 shown in FIG. 1. In FIG. 5, switching circuit 21 includes a circuit block 21a which is responsive to signal /EN to perform/inhibit transmission of the memory cell data received from sense amplifier 6, a circuit portion 21b which is responsive to priority signal /EN1 to output the signal of "L" (data of logic "0") to output buffer 70, and a circuit portion 21c which is responsive to priority signal /EN2 to output the signal of potential "H" (data of logic "1") to output buffer 70.

First circuit portion 21a includes a p-channel MOS transistor Q16 and an n-channel MOS transistor Q17 which are connected in series and turn on and off complementarily with each other and receive at their gates the memory cell data read from sense amplifier 6. The portion 21a also includes a p-channel MOS transistor Q15 which is placed between transistor Q16 and power supply potential Vcc and receives signal /EN at its gate through inverter circuit G11, and an n-channel MOS transistor Q18 which is placed between transistor Q17 and ground potential Vss and receives signal /EN at its gate.

Second circuit portion 21b includes a depletion type MOS transistor Q11 which has one conduction terminal connected to a node N20 and a gate connected to ground potential Vss, an enhancement type n-channel MOS transistor Q12 which has one conduction terminal connected to node N20 and a gate connected to ground potential Vss, a p-channel MOS transistor Q19 which is placed between transistor Q11 and supply potential Vcc and receives priority signal /EN1 at its gate, and an n-channel MOS transistor Q20 which is placed between transistor Q12 and ground potential Vss and receives priority signal /EN1 at its gate through inverter circuit G12.

Third circuit portion 21c includes an enhancement type n-channel MOS transistor Q13 which has one conduction terminal connected to node N20 and a gate connected to ground potential Vss, a depletion type MOS transistor Q14 which has one conduction terminal connected to node N20 and a gate connected to ground potential Vss, a p-channel MOS transistor Q21 which is connected between transistor Q13 and supply potential Vcc and receives priority signal /EN2 at its gate, and an enhancement type n-channel MOS transistor Q22 which is connected between transistor Q14 and ground potential Vss and receives priority signal /EN2 at its gate through inverter circuit G13. The signal potential of node N20 is transmitted through an inverter circuit G14 to the output buffer 70.

Programming of the enhancement/depletion transistors Q11, Q12, Q13 and Q14 is carried out in the manufacturing process of the memory, similarly to the previously described address coincidence detecting circuits. In accordance with the program state of transistors Q11–Q14, fixed data is output depending on priority signals /EN1 and /EN2. FIG. 6 shows a list of a relationship between the program states of transistors Q11 and Q12 included in second circuit portion 21b and the output signals from switching circuit 21 in the respective states.

(i) If transistor Q11 is programmed to be of the depletion type and transistor Q12 is programmed to be of the enhancement type, transistor Q11 is set in the normally ON state, and transistor Q12 is set in the normally OFF state. Therefore, when priority signal /EN1 is generated, node N20 is charged to "H" through transistors Q19 and Q11, and the output signal from switching circuit 21 goes to "L" (logic "0").

(ii) If transistor Q11 is programmed to be of the enhancement type and transistor Q12 is programmed to be of the depletion type, transistor Q11 is set in the normally OFF state, and transistor Q12 is set in the normally ON state. Therefore, when priority signal /EN1 is generated, node N20 is discharged to ground potential Vss through transistors Q12 and Q20, and the output of switching circuit 21 goes to "H" (logic "1"). The programming of transistors Q11–Q14 to enhancement/depletion types is determined in accordance with the data in the address regions represented by priority signals /EN1 and /EN2. An operation will be briefly described blow.

When an address coincidence detecting signal is generated, signal /EN goes to the active state of "L". Transistors Q15 and Q18 are set in the OFF state to prohibit the transmission of the memory cell data supplied from sense amplifier 6 to output buffer 70. When priority signal /EN1 is generated, in the construction shown in FIG. 5, node N20 is charged to "H". Therefore, data "0" at "L" is supplied through inverter G14 to output buffer 70. When priority signal /EN2 is generated, transistors Q14 and Q22 set node N20 at "L", and switching circuit 21 outputs a signal of "H".

When no coincidence detection signal is generated, all the signals /EN, /EN1 and /EN2 are in the inactive state of "H".

In this condition, both transistors Q15 and Q18 are in the ON state to activate the first circuit portion 21a, and the second circuit portion 21b and the third circuit portion 21c are in the inactive state. Therefore, the memory cell data transmitted from sense amplifier 6 is output through inverter circuit G14.

Figure 17:
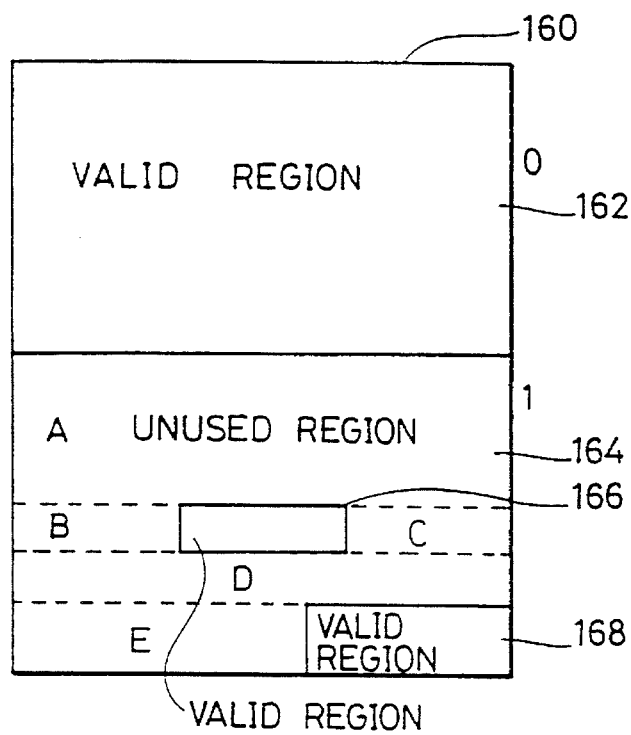
FIG. 17 is a diagram for showing another problem of the conventional mask ROM shown in FIG. 15.

In the circuit construction shown in FIG. 3, the fixed data is output in accordance with the coincidence detection signal having the higher priority. Alternatively, even in a case that the valid memory cell data exists in the invalid (unused or undefined) region as shown in FIG. 17, the replacement of the fixed data and the memory cell data can be efficiently carried out in accordance with the coincidence detection signals having the priority order. For example, if the region 221 in FIG. 2 stores valid memory cell data, the circuit 21b is removed from the circuitry shown in FIG. 5. The signal /EN1 is used only for controlling the signal /EN. That is, as shown by a logic gate in a dashed line in FIG. 3, the signal /EN1 of "L" produces the signal /EN' of "H" which is supplied to the circuit 21a in place of the signal /EN. When the signal /EN1 is inactive at "H", the logic gate drawn in the dashed line passes the signal /EN as received to generate the signal /EN'.

Figure 7:
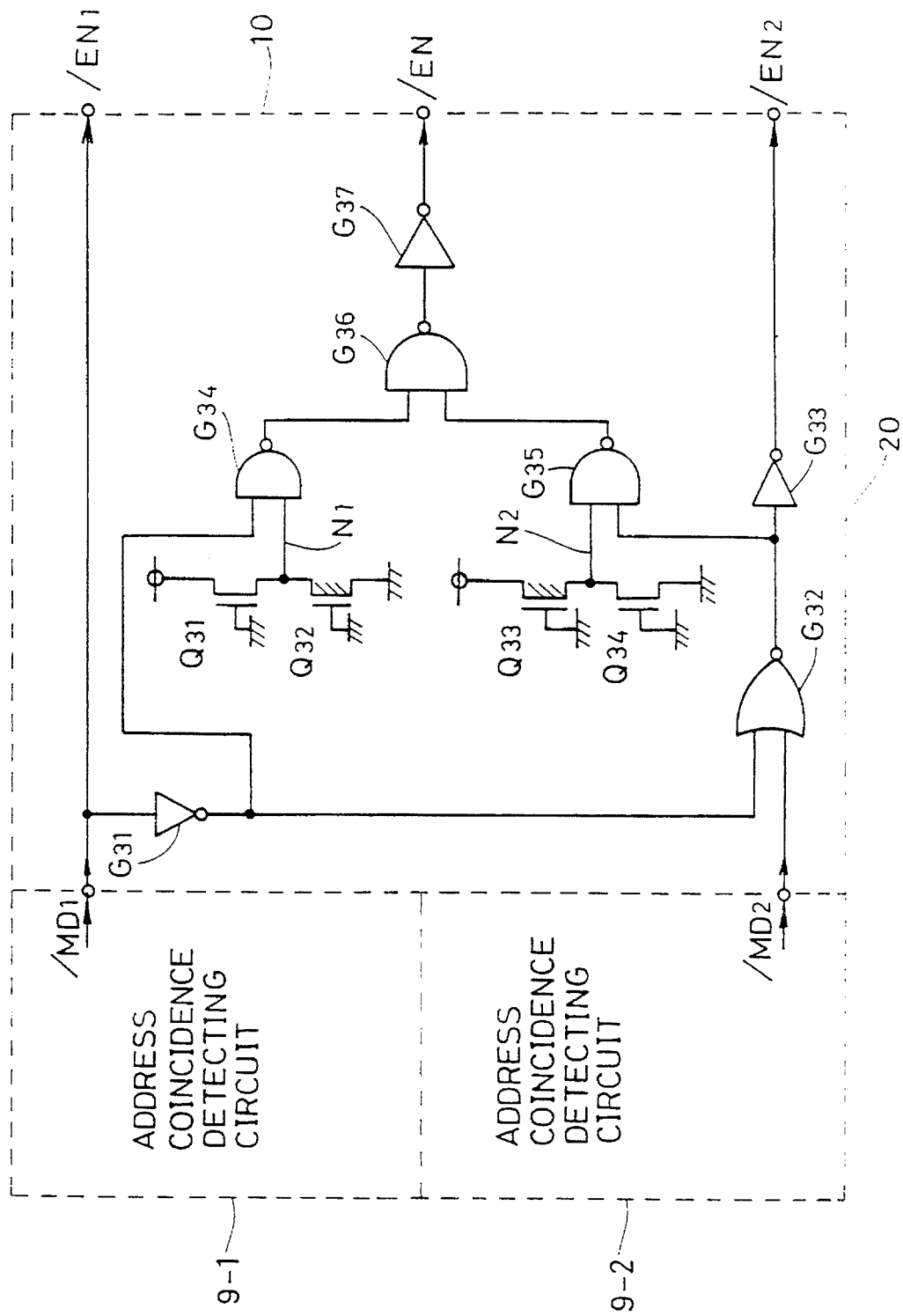
FIG. 7 shows another example of a construction of a priority circuit shown in FIG. 1.

FIG. 7 shows an example of a specific construction of priority circuit 20 used in the read only semiconductor memory device according to another embodiment of the invention. In FIG. 7, priority circuit 20 includes an inverter circuit G31 which receives coincidence detection signal /MD1 from address coincidence detecting circuit 9-1, and a NAND circuit G34 which receives an output of inverter circuit G31 at its one input. The other input of NAND circuit G34 receives fixed data which is determined by an enhancement transistor Q31 and a depletion transistor Q32 receiving the ground potential at their respective gates. Transistors Q31 and Q32 are connected in series between supply potential Vcc and ground potential Vss.

Priority circuit 20 further includes a NOR circuit G32 which in turn has one input for receiving coincidence detection signal /MD2 from address coincidence detecting circuit 9-2 and the other input for receiving the output of inverter circuit G31, and a NAND circuit G35 for receiving at its one input an output of NOR circuit G32. The other input of NAND circuit G35 receives fixed data which is determined by a depletion transistor Q33 and an enhancement transistor Q34. Transistors Q33 and Q34 are connected at their gates to ground potential Vss, and are connected in series between supply potential Vcc and ground potential Vss.

Priority circuit 20 further includes a NAND circuit G36 which receives an output of NAND circuit G34 and an output of NAND circuit G35, an inverter circuit G37 which receives an output of NAND circuit G36, and an inverter circuit G33 which receives an output of NOR circuit G32.

Coincidence detecting signal /MD1 is directly output as priority signal /EN1. Inverter circuit G37 outputs control signal /EN, and inverter circuit G33 outputs priority signal /EN2. NAND circuit G34 receives at its other input the signal having the potential level of "L" fixed by transistors Q31 and Q32 through node N1. NAND circuit G35 receives at its other input the data which is fixed at "H" by transistors Q33 and Q34 through node N2. Therefore, if transistors Q32 and Q33 are of the depletion type and transistors Q31 and Q34 are of the enhancement type, as shown in the list of FIG. 8, NAND circuit G34 is in the inactive state and provides a fixed output of "H". Meanwhile, NAND circuit G35 is in the active state and operates as an inverter circuit.

In the priority circuit construction shown in FIG. 7, when coincidence detecting signal /MD1 goes to "L", inverter circuit G31 outputs the signal of "H", so that the output signal of NOR circuit G32 become "L" regardless of the logical level of coincidence detection signal /MD2. Accordingly, the output of NAND circuit G35 is "H", so that the output signal of NAND circuit G36 becomes "L" and the signal /EN becomes "H".

When only coincidence detection signal /MD 2 is generated, both inputs of NOR circuit G32 become "L", so that the output of NOR circuit G32 becomes "H", and the output of NAND circuit G35 becomes "L". Accordingly, the output of NAND circuit G36 becomes "H", and signal /EN from inverter circuit G37 becomes "L".

Signal /EN is used for determining whether or not the memory cell data should be transmitted to the output buffer. The priority of coincidence detecting signal /MD1 is higher than that of coincidence detection signal /MD2. The output signals /EN1, /EN and /EN2 of priority circuit 20 shown in FIG. 7 are transmitted to switching circuit 21 shown in FIG. 5.

In switching circuit 21 shown in FIG. 5, if transistor Q11 and Q12 are programmed to be of enhancement type, second circuit portion 21b is in the inactive state independently of the signal /EN1. Therefore, when control signals /EN at "H" and /EN1 at "L" are generated, memory cell data is transmitted from sense amplifier 6 to output buffer 70.

Therefore, in a case that valid region 166 exists in unused region 164, as shown in FIG. 17, and when an address of valid region 166 is designated, coincidence detecting signal /MD1 is generated. In the same case, when an address of unused region 164 is designated, coincidence detection signal /MD2 is generated to provide a data of a predetermined logic level. In this construction, the valid data of a memory cell in valid region 166 is transmitted through switching circuit 21 to output buffer 70.

The embodiment described above employs two address coincidence detecting circuits, and the output data is determined in accordance with the priority order in the two address regions. This construction may be expanded to three or more 3 address regions.

Figure 9:
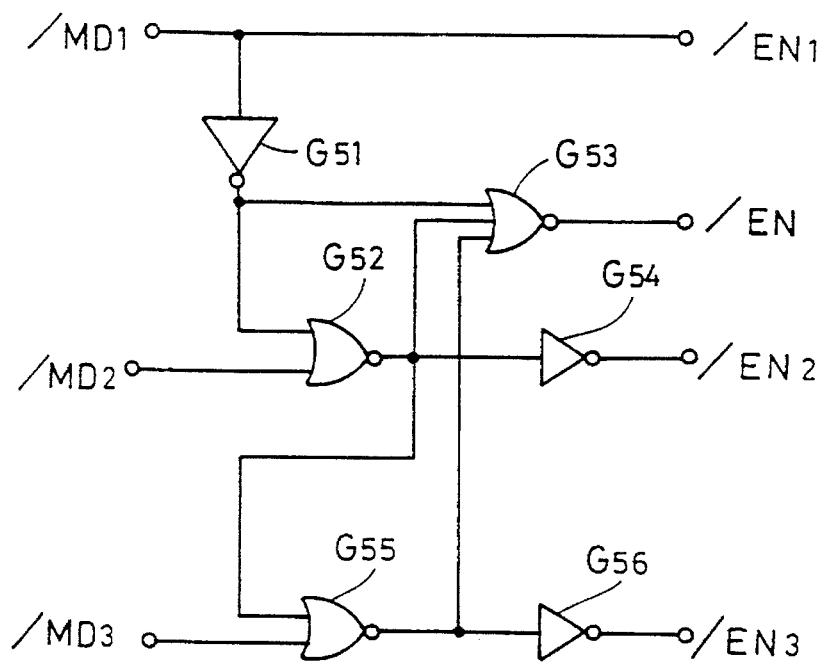
FIG. 9 shows another different example of a construction in which the priority circuit has three address regions.

FIG. 9 shows an example of a construction of the priority circuit used in the mask ROM according to further another embodiment of the invention. In FIG. 9, priority circuit 20 gives the priority to one of three coincidence detection signals /MD1, /MD2 and /MD3 to output the same. Priority circuit 20 includes an inverter circuit G51 for receiving coincidence detection signal /MD1, NOR circuit G52 for receiving an output of inverter circuit G51 and coincidence detection signal /MD2, NOR circuit G55 for receiving an output of NOR circuit G52 and coincidence detection signal /MD3, NOR circuit G53 for receiving the outputs of inverter circuit G51, NOR circuit G52 and NOR circuit G55. NOR circuit G53 outputs control signal /EN. The output of NOR circuit G52 is converted by inverter circuit G54 into priority signal /EN2. The output of NOR circuit G55 is converted by inverter circuit G56 into priority signal /EN3.

This circuit construction is merely an expansion of the priority circuit shown in FIG. 3, and the priority is assigned to coincidence detection signal /MD1, coincidence detecting signal /MD2 and coincidence detection signal/MD3 in this order. Thus, when coincidence detecting signal /MD1 is output, priority signal /EN1 and control signal /EN are generated regardless of the true/false state of the remaining coincidence detection signals /MD2 and /MD3.

When coincidence detecting signal /MD1 is not generated, and coincidence detection signal /MD2 is generated, control signal /EN and priority signal /EN2 are generated.

When only coincidence detecting signal /MD3 is generated, control signal /EN and priority signal /EN3 are generated.

Figure 10:
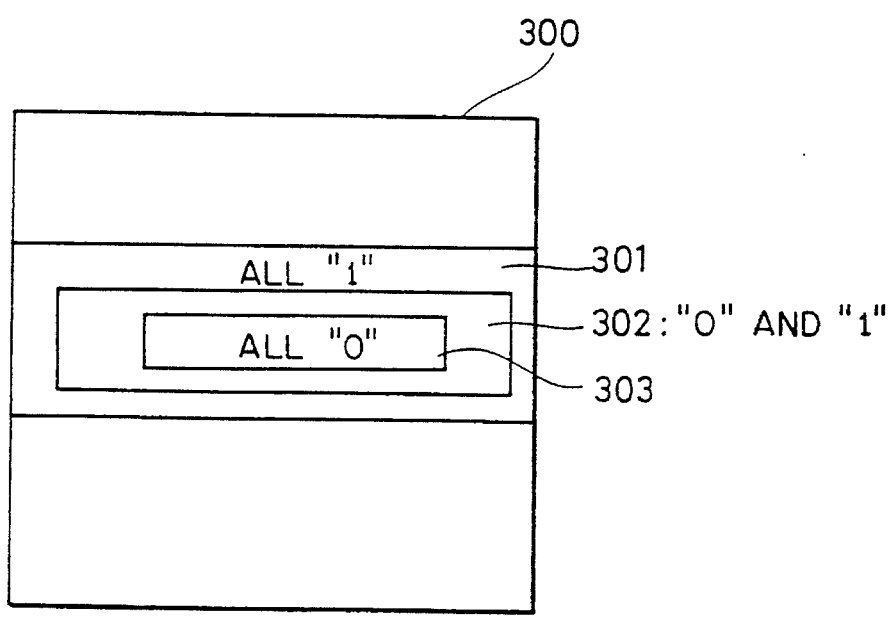
FIG. 10 is a diagram for showing an operation of the priority circuit shown in FIG. 9.

In the circuit construction for determining the priority shown in FIG. 9, such a case can be easily dealt with that, in memory address region 300, region 301 contains memory region 302 which in turn contains memory region 303, as shown in FIG. 10. If such a relationship is established that memory region 303 corresponds to coincidence detection signal /MD1, memory region 302 corresponds to coincidence detection signal /MD2, and memory region 301 corresponds to coincidence detection signal /MD3, the output data based on these three memory regions 301, 302 and 303 can be easily set at the fixed data. In this case, if the priority circuit shown in FIG. 7 is expanded, the data to be supplied corresponding to three regions 301, 302 and 303 can be generated from either the predetermined fixed data or the data read from memory cell.

If the region 302 stores valid memory cell data with data "1" and "0" mixed while the regions 301 and 303 store data of only "1" and of only "0" respectively, the signal /EN2 at active "L" disables the signal /EN for transferring a read out memory cell data to the output.

Figure 11:
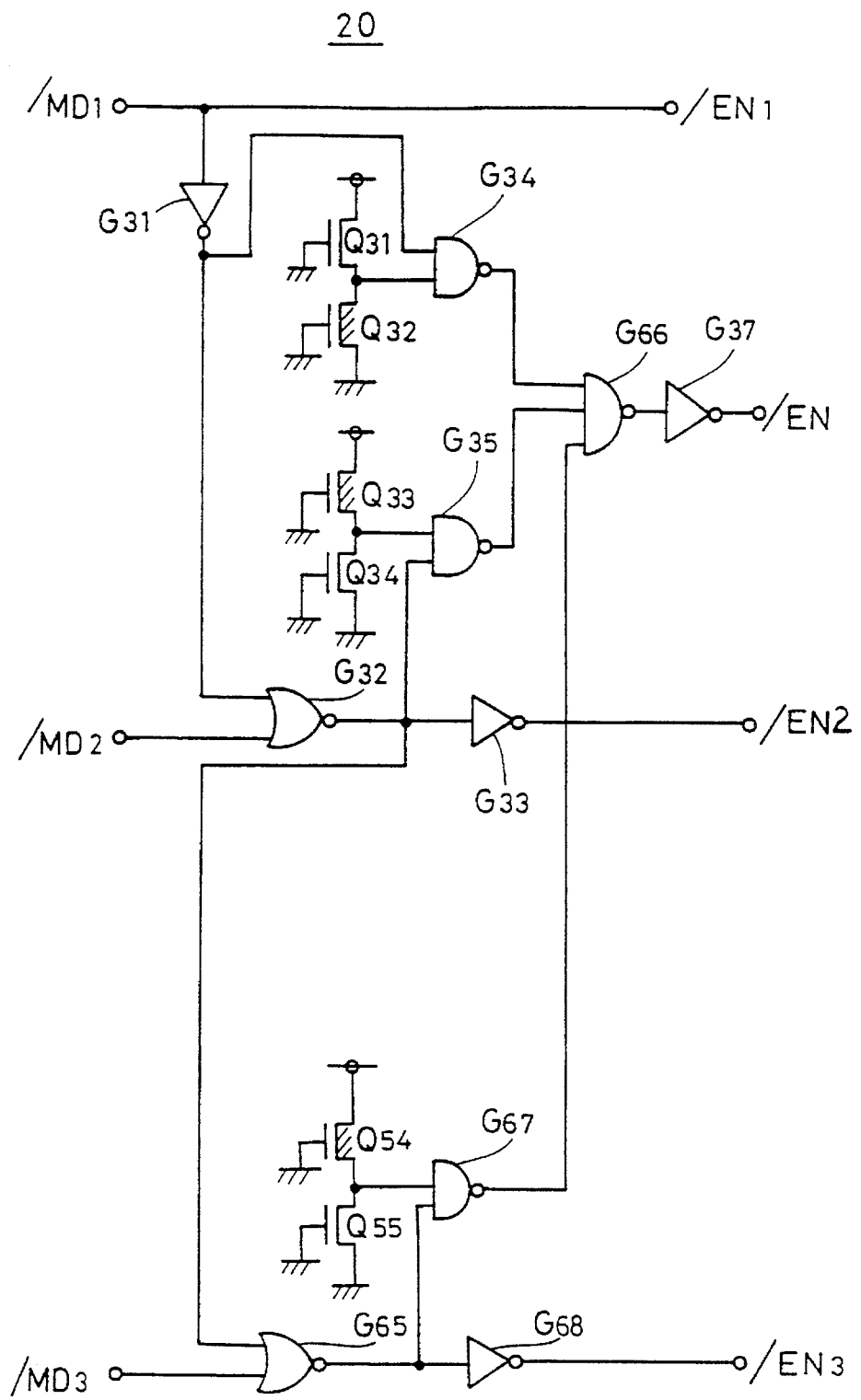
FIG. 11 shows another example of a construction in which the priority circuit shown in FIG. 7 is expanded for three address regions.

FIG. 11 shows a more detailed construction in which priority circuit shown in FIG. 7 is expanded to deal with three regions. In FIG. 11, portions corresponding to circuit elements shown in FIG. 7 have the same reference numerals allotted thereto. Priority circuit 20 shown in FIG. 11 includes, in addition to priority circuit 20 shown in FIG. 7, a NOR gate circuit G65 for receiving the output of NOR gate G32 and coincidence detection signal /MD3, a NAND circuit G67 which receives at its one input the fixed data set by transistors Q54 and Q55 and receives at the other input an output of NOR circuit G65, and an inverter circuit G68 for inverting the output of NOR circuit G65. Inverter circuit G68 generates priority signal /EN3. An output of NAND circuit G67 is applied to 3-input NAND circuit G66. 3-input NAND circuit G66 also receives the outputs of NAND circuits G34 and G35.

Transistors Q54 and Q55 are programmed to be of the depletion type and the enhancement type, respectively, so that the fixed data of "H" is transmitted to the one input of NAND circuit G67, and thus NAND circuit G67 functions as an inverter.

In the construction of priority circuit 20 shown in FIG. 11, when coincidence detecting signal /MD1 is output, priority signal /EN1 is generated, and signal /EN becomes "L" regardless of the states of remaining coincidence detecting signals /MD2 and /MD3.

When coincidence detecting signal /MD1 is not generated and coincidence detection signal /MD2 is generated, NOR circuit G32 supplies the signal of "H" and NAND circuit G35 provides the output of "L", so that the output of NAND circuit G66 becomes "H", and control signal EN is set at "L" by inverter circuit G37. In this condition, inverter circuit G33 generates signal /EN2 of "L".

Priority signal /EN3 is in the inactive state of "H", because NOR circuit G32 transmits the signal of "H" to the one input of NOR circuit G65.

When only coincidence detection signal /MD3 is generated, the output of NOR circuit G65 becomes "H", and the output signal of NAND circuit G67 becomes "L", so that the output of NAND circuit G66 becomes "H". Thereby, control signal /EN at "L" is generated. Priority signal /EN3 is set in the active state of "L" by inverter circuit G63.

In this construction, when coincidence detection signal /MD1 is generated, control signal /EN goes to the inactive state of "H", so that the memory cell data is output upon designation of the address region which is designated by address coincidence detecting signal /MD1.

Circuit constructions shown in FIGS. 9 and 11 may be further expanded so as to correspond to more regions. The circuit construction is not limited to the case that memory region 301 contains memory region 302 which in turn contains region 303 as shown in FIG. 10, but can be applied to a case that memory regions 302 and 303 exist in parallel (e.g., adjacent) or are individual address regions separately provided in a non-overlapping manner in region 301. In this case, address regions existing in parallel have the same priority. However, circuit constructions shown in FIGS. 9 and 11 can be applied as they are, because coincidence detection signals are not generated simultaneously for these parallel address regions.

Further, in all the embodiments described above, data bits to be transmitted to the output buffer are set in accordance with control signal /EN, priority signal /EN1 and such. In this case, a construction shown in FIG. 12 may be employed, in which replacement of data and/or reading of memory cell data are performed for each output data bit.

FIG. 12 schematically shows a whole construction of a mask ROM according to another embodiment of the invention. In FIG. 12, an output data comprises 16 bits. Memory array 5 is divided into 16 memory blocks #1 to #16 respectively corresponding to output data D0 to D15 of 16 bits. Memory blocks #1 to #16 each output 1 bit data in parallel. Switching circuit 21 includes switching circuits SW1 to SW16 which are provided correspondingly to memory blocks #1 to #16, respectively.

In order to control the switching operation individually for respective switching circuits SW1 to SW16, a priority block 500 includes similar switching signal generating circuits for the respective bits. The address coincidence detecting circuits may be provided for the respective bits, or the coincidence detecting circuit may be provided commonly for a plurality of memory blocks.

Output buffer 70 includes buffer circuits OB1 to OB16 respectively provided for bits D0 to D15.

In this construction, setting of the fixed data and the selective passage of the memory cell data supplied from memory array 5 can be performed independently for each memory block, and further, degree of freedom of the data replacement is increased. Therefore, efficient replacement of the data and the repair of the defective bit are implemented.

Figure 13A:
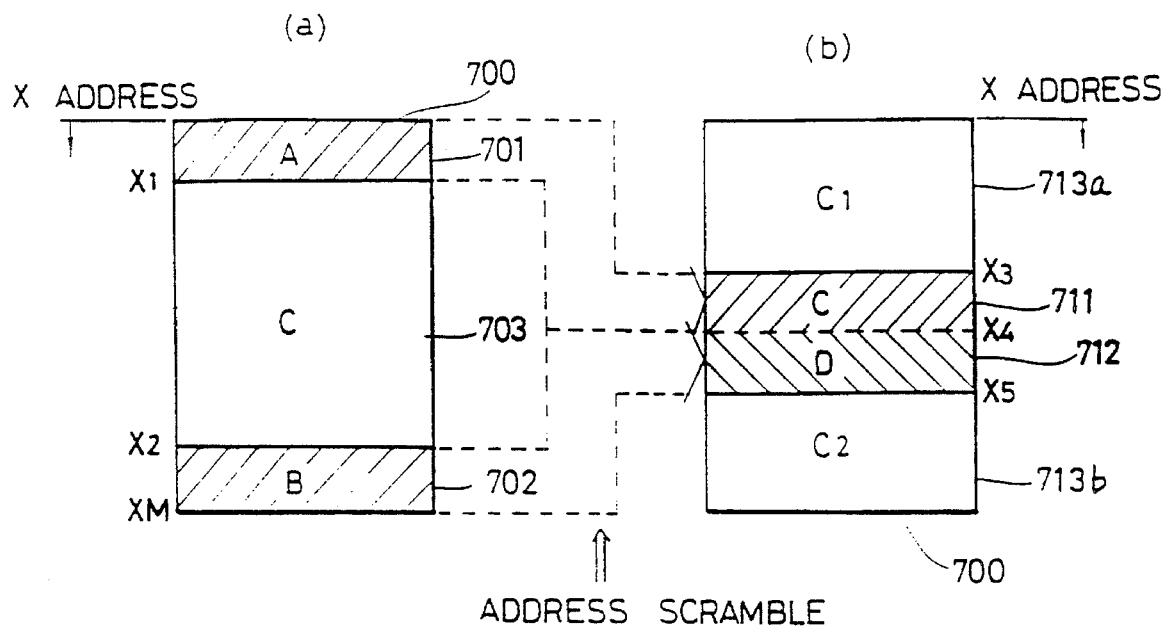
FIGS. 13A–13C are diagrams for showing an address conversion of the read only semiconductor memory device of another embodiment of the invention.

Further, if regions each containing succession of same data are dispersed in the full memory address region, these regions may be rearranged another successive same data memory regions in the memory space. As shown in FIG. 13A(a), if a memory region 700 contains memory regions 701 and 702, each of which contains a succession of the data of "1" or "0", memory regions 701 and 702 are rearranged to regions 711 and 712 in the memory region 700, as shown in FIG. 13A(b). The region 703 is split into two regions 713a and 713b. In the address scrambling, the X address is converted by addition of an offset address. For example, an offset address X3-X1 is added to an address in the region 701 while an offset address X5-X2 is added to an address in the region 702 with respect to X address.

Figure 13B:
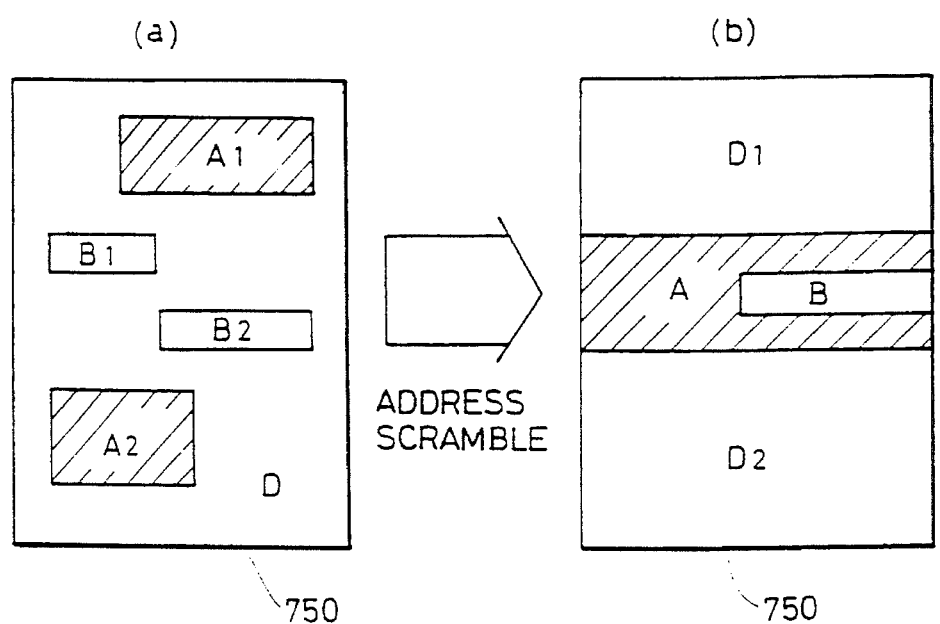

An address in the region 703 is appropriately converted to be included in the region 713a or 713b. This address conversion can be expanded as shown in FIG. 13B. In FIG. 13B(a), an address space (memory address space) 750 contains a region D storing valid memory cell data, separated regions A1 and A2 storing data of only "1(s)", and separated regions B1 and B2 storing data of only "0(s)". In this arrangement, an address is scrambled with respect to X and Y addresses, resulting in the arrangement of FIG. 13B(b) in which the regions A1 and A2 are combined in a region A, the regions B1 and B2 are combined into a region B surrounded by the region A. The region D is split into two regions D1 and D2 separated by the region A. An external address signal designates an address in the address space of FIG. 13B(b).

Figure 13C:
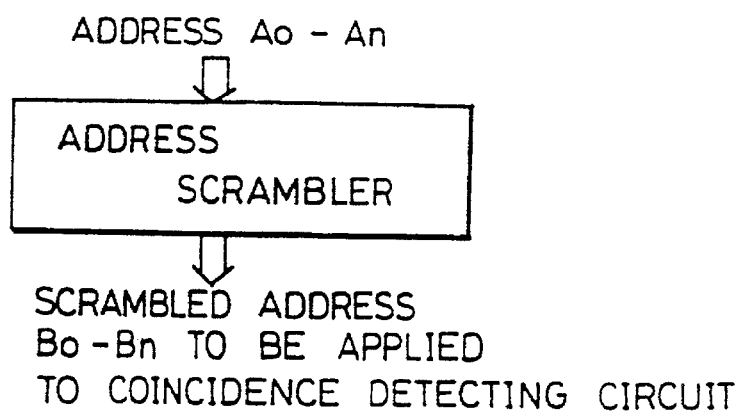
Figure 14:
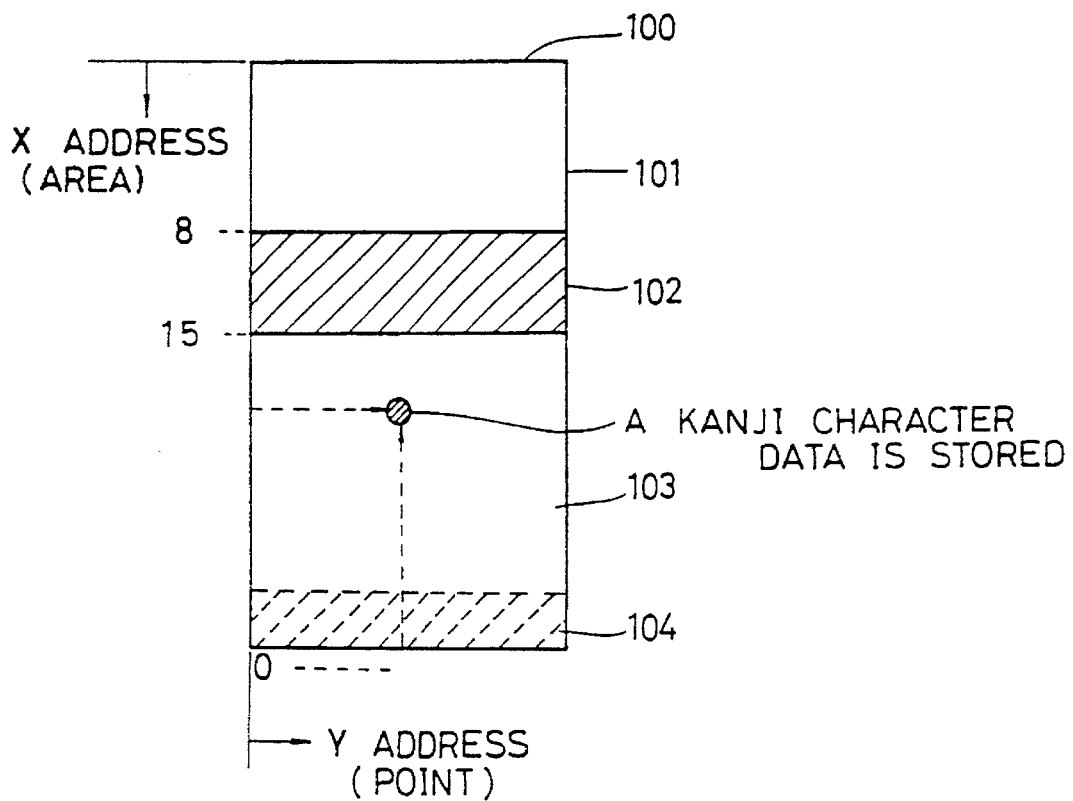
FIG. 14 shows an example of a bit mapping in a conventional mask ROM.

For such an address scrambling, an address scrambler is employed as shown in FIG. 13C. The address scrambler comprises a memory table. When an address A0–An is applied, the address scrambler supplies a corresponding converted or scrambled address B0–Bn. The address scrambler stores scrambled addresses in one to one relationship to external addresses. Regions 701 and 702 as well as 710 and 711 may actually represent the physical memory locations in the memory array, or may indicate the address regions in the memory address space.

Thus, address regions containing a succession of the data of "1" or "0" are formed by rearranging the address signals in the mask ROM in accordance with an address scrambling circuit, and the circuitry for performing the data replacement according to the embodiments is applied to these scrambled address regions, whereby the data replacement can be achieved more efficiently.

In preparing a conversion or scrambling table, data processing is carried out by a computer in advance in order to provide an appropriate data distribution in the address space, and then data processing for address conversion is carried out, in order to provide an effective data arrangement. Based on these data processings, the addresses are scrambled and scrambled addresses are programmed in the address scrambler. A scrambling circuit for this purpose is provided at a stage upstream of the address buffer or an output stage thereof. The scrambling circuit has a programmable construction using transistors of the enhancement or depletion type described previously. The address coincidence detecting circuit receives the address signals which have been scrambled.

According to the invention, as described hereinabove, there are provided address coincidence detecting circuits, the priority is given to one of the coincidence detection signals from these address coincidence detecting circuits, and setting of the output data is performed in accordance with the priority. Therefore, regardless of the state of the successive same data regions, the replacement of the data can be efficiently and easily carried out, and the region for repairing the defective bits can be remarkably increased, resulting in the read only semiconductor memory device having a high product yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A read only semiconductor memory device including a memory cell array having a plurality of read only memory cells, each memory cell having an address corresponding thereto, said device comprising:

a data output terminal;

a plurality of address coincidence detecting means, each having a specific address region corresponding thereto, for detecting whether a received address signal designates an address in the specific address region corresponding thereto;

priority ordering means responsive to outputs of said plurality of address coincidence detecting means for determining a priority order among said outputs of said plurality of address coincidence detecting means; and switching means responsive to said priority ordering means for selectively fixing said data output terminal at a predetermined logic level based on the priority order determined by said priority ordering means.

2. A device according to claim 1, wherein said priority ordering means includes means for generating a signal indicative of no detection of address coincidence in any of said plurality of address coincidence detecting means, and said switching means includes means, responsive to said signal, for outputting data of a selected memory cell in said memory array to said data output terminal.

3. A device according to claim 1, wherein said switching means includes means, responsive to an output of said priority ordering means, for outputting data of a selected memory cell in said memory array to said data output terminal when a particular priority ordering is determined by said priority ordering means.

4. A device according to claim 1, wherein each of said plurality of address coincidence detecting means includes field effect transistors, each selectively programmable into one of an enhancement type, and a depletion type for storing an address indicating a corresponding specific address region.

5. A device according to claim 1, wherein said switching means includes field effect transistors, each selectively programmable into one of an enhancement type and a depletion type for storing data corresponding to said predetermined logic level.

6. A device according to claim 1, wherein said specific address region contains a succession of data of the same logic level.

7. A device according to claim 1, wherein said priority ordering means, includes means responsive to said outputs of said plurality of address coincidence detecting means, for generating a signal indicative of detection of address coincidence in any of said plurality of address coincidence detecting means, and means for giving priority to one of said outputs of said plurality of address coincidence detecting means.

8. A device according to claim 7, wherein said switching means includes means responsive to an output of said means for giving priority, for setting said output terminal at the predetermined logic level, and means, responsive to said signal, for inhibiting transfer of data read out from a selected memory cell in said memory array to said data output terminal.

9. A device according to claim 1, wherein said data output terminal includes a plurality of pin terminals, and said memory array is divided into a plurality of memory blocks provided corresponding to said plurality of pin terminals, and wherein a plurality of said switching means is provided each corresponding to a respective memory block to operate independently with each other.

10. A device according to claim 9, wherein said priority ordering means is provided for each corresponding respective memory block.

11. A semiconductor memory device, comprising:

a memory cell array including a plurality of read only memory cells;

selection means responsive to an address signal for selecting a memory cell in said memory cell array and reading data out of the selected memory cell;

a plurality of address coincidence detecting means, each storing a specific address region, for detecting coincidence and non coincidence of the address signal with said specific address region of a corresponding address coincidence detecting means;

priority ordering means responsive to outputs of said plurality of address coincidence detecting means for determining a highest priority output among said outputs of said plurality of address coincidence detecting means when an address coincidence is detected in one of said plurality of address coincidence detecting means; and switching means, responsive to a highest priority output, for preventing an output data received from said selection means and supplying data of a predetermined logic level based on said highest priority output.

12. A semiconductor memory device according to claim 11, wherein said priority ordering means includes means, responsive to a signal indicative of detection of address coincidence from one of said plurality of address coincidence detecting means, for generating a second signal, and said switching means includes means responsive to said second signal for preventing transfer of the output data received from said selection means.

13. A semiconductor memory device according to claim 11, wherein said memory array includes a plurality of memory blocks accessible in parallel, and said selection means selects one memory bit in each of said plurality of memory blocks, and wherein said switching means includes means provided for each of said plurality of memory blocks and responsive to said highest priority output, for operating independently of each other.

14. A semiconductor memory device, comprising:

a memory cell array including a plurality of read only memory cells;

selection means responsive to an address signal for selecting a memory cell in said memory cell array and reading data out of the selected memory cell;

a plurality of address coincidence detecting means having a predetermined priority order among outputs thereof, each of said plurality of address coincidence detecting means storing data indicating a corresponding specific address region, and determining whether said address signal designates an address in the corresponding specific address region; and output control means, responsive to outputs of said plurality of address coincidence detecting means, for selectively outputting data of said selected memory cell or data of a fixed logic level.

15. A semiconductor memory device according to claim 14, wherein said output control means includes first means, responsive to one of said plurality of address coincidence detecting means determining that said address signal designates an address in a first specific address region, for preventing output of data of said selected read only memory cell and supplying data of a predetermined logic level corresponding to data stored in said first specific address region, and second means, responsive to one of said plurality of address coincidence detecting means detecting that said address signal designates an address in a second specific address region surrounded by said first specific address region, for outputting data received from said selection means.

16. A semiconductor memory device according to claim 15, wherein said first specific address region includes a plurality of address areas, and wherein said first means includes means, responsive to received outputs of said plurality of address coincidence detecting means determining that said address signal designates said first specific address region, for detecting a highest priority output among the received outputs in accordance with a predetermined priority order, and means, responsive to the detected highest priority output, for outputting data of a fixed logic level corresponding to data stored in said first specific address region of said read only memory which is detected to have the highest priority output among the received outputs of said plurality of address coincidence detecting means.

17. A semiconductor memory device, comprising:

an array including a plurality of memory cells;

selection means receiving an address signal and selecting a memory cell in said array;

first address coincidence detecting means for receiving said address signal and for generating a coincidence signal when said address signal coincides with an address corresponding to a first address region in said array and generating a noncoincidence signal when said address signal is not coincident with the address corresponding to the first address region;

second address coincidence detecting means receiving said address signal and generating a coincidence signal when said address signal coincides with an address corresponding to a second address region included in said first address region and generating a noncoincidence signal when said address signal is not coincident with the addresses corresponding to the second address region;

control means, responsive to said first and second address coincidence detecting means, for supplying data of the memory cell selected by said selection means when receiving the coincidence indicating signals from said first and second address coincidence detecting means, supplying data of a predetermined logical level when receiving the coincidence indicating signal from said first address coincidence detecting means and the noncoincidence indicating signal from said second address coincidence detecting means, and supplying the data of the memory cell selected by said selection means when receiving the noncoincidence indicating signals from said first and second address coincidence detecting means.

18. A method of operating a semiconductor memory device including a plurality of read only memory cells, comprising the steps of:

selecting a memory cell in said plurality of memory cells in response to an address signal;

determining whether said address signal designates an address in a specific address region of one or more specific address regions;

performing priority ordering based on one or more addresses of specific address regions designated by said address signal if the determining step determines that said address signal designates an address in said one or more specific address regions;

prohibiting output of data of the selected memory cell and outputting a predetermined logic level which is stored in one specific address region if said address signal designates an address in a single specific address region of said one or more specific address regions or outputting the predetermined logic level data stored in a highest priority specific address region if an address signal designates an address in more than one of said one or more specific address regions.

19. A method according to claim 18, further comprising the steps of:

converting an address so that, in a memory address space formed by said plurality of read only memory cells, separate first and second address regions, each including data of the same logic level, are combined into one address region, and generating said address signal from the converted address.

20. A method of operating a semiconductor memory device including a plurality of read only memory cells, comprising the steps of:

selecting a memory cell in said plurality of read only memory cells in response to an address signal and reading data out of the selected memory cell;

outputting data of the selected memory cell if the address signal designates an address in a first specific address region; and outputting a predetermined logic level while prohibiting output of data of the selected memory cell if the address signal designates an address in a second specific address region, said first specific address region being within said second specific address region.

21. A method according to claim 20, wherein said second specific address region includes a plurality of specific address areas, and said step of outputting the predetermined logic level includes the steps of determining priority among the plurality of specific address areas, and outputting predetermined logic level data corresponding to data stored in a highest priority specific address area.

* * * * *